United States Patent
Matsumoto

(10) Patent No.: US 7,752,591 B2
(45) Date of Patent: Jul. 6, 2010

(54) BOARD LAYOUT CHECK APPARATUS AND BOARD LAYOUT CHECK METHOD FOR GUARD WIRING

(75) Inventor: Takehide Matsumoto, Tenri (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 293 days.

(21) Appl. No.: 11/826,764

(22) Filed: Jul. 18, 2007

(65) Prior Publication Data

US 2008/0022242 A1     Jan. 24, 2008

(30) Foreign Application Priority Data

Jul. 18, 2006    (JP) .............................. 2006-195662

(51) Int. Cl.
*G06F 17/50* (2006.01)
(52) U.S. Cl. ............... 716/15; 716/4; 716/5; 716/6; 716/8; 716/9; 716/10; 716/11
(58) Field of Classification Search ............... 716/4–6, 716/8–11, 15
See application file for complete search history.

(56) References Cited

U.S. PATENT DOCUMENTS

| | | | | |
|---|---|---|---|---|
| 6,510,545 B1 * | 1/2003 | Yee et al. | ............... | 716/12 |
| 6,691,296 B1 * | 2/2004 | Nakayama et al. | ............... | 716/15 |
| 7,137,097 B1 * | 11/2006 | Aji et al. | ............... | 716/12 |
| 7,257,792 B2 * | 8/2007 | Nakayama et al. | ............... | 716/11 |
| 7,257,794 B2 * | 8/2007 | Tang et al. | ............... | 716/11 |
| 2001/0011362 A1 * | 8/2001 | Yoshinaga | ............... | 716/8 |
| 2008/0059917 A1 * | 3/2008 | Shimizu et al. | ............... | 716/2 |
| 2008/0276213 A1 * | 11/2008 | Aoki et al. | ............... | 716/13 |

FOREIGN PATENT DOCUMENTS

| | | | |
|---|---|---|---|
| JP | 2000-20573 A | | 1/2000 |
| JP | 2000259695 A | * | 9/2000 |

* cited by examiner

*Primary Examiner*—Naum B Levin
(74) *Attorney, Agent, or Firm*—Birch, Stewart, Kolasch & Birch, LLP

(57) ABSTRACT

There is provided a board layout check apparatus for checking whether or not a guard wiring is appropriately formed, wherein a place which must be corrected is clearly displayed.

The board layout check apparatus includes a printed board obtained by forming a guard wiring on a printed wiring layer, a check target wiring detecting unit which detects a check target wiring the influence of noise of which must be reduced from the printed wiring layer, a guard wiring exemption region calculating unit which calculates a guard wiring exemption region in which no guard wiring is formed for the check target wiring, a guard wiring detecting unit which detects a wiring portion in which a guard wiring is formed for the check target wiring, an error determination unit which determines whether or not the guard wiring is appropriately formed in a region except for the guard wiring exemption region, and an output unit which outputs a wiring portion determined as an error by the error determination unit.

8 Claims, 4 Drawing Sheets

BOARD LAYOUT CHECK APPARATUS AND BOARD LAYOUT CHECK METHOD FOR GUARD WIRING

CROSS-REFERENCE TO RELATED APPLICATION

This application is related to Japanese Patent Application No. 2006-195662 filed on Jul. 18, 2006, whose priority is claimed under 35 USC §119, the disclosure of which is incorporated by reference in its entirety.

BACKGROUND OF THE INVENTION

1. Field of the Invention

The present invention relates to a board layout check apparatus and a board layout check method for a printed board and, more particularly, to a board layout check apparatus and a board layout check method for checking whether or not guard wirings are appropriately arranged on printed wiring layers on the printed board. The present invention also relates to a computer readable recording medium on which a board layout check program is recorded.

2. Description of Related Art

With an increase in operation frequency of an electronic circuit, a countermeasure against electromagnetic radiated emission of an electronic appliance becomes important. As a measure against noise on a printed board, a method of arranging guard wirings on both the sides of an important wiring or a high-speed signal wiring such as a clock wiring is generally used. The guard wirings are arranged for the clock wiring or the high-speed signal wiring to advantageously reduce influence of noise generated from other wirings and parts. Furthermore, a guard wiring is arranged for the clock wiring or the high-speed signal wiring to make it possible to reduce influence of noise to other wirings, parts, and the like.

A system which checks whether or not a guard wiring is appropriately formed at a necessary place is disclosed in Japanese Unexamined Patent Publication No. 2000-20573. In a board wiring process system disclosed in Japanese Unexamined Patent Publication No. 2000-20573, a wiring pattern for a clock signal is detected to detect whether or not two upper and lower layers of the wiring pattern are wired only by a power supply/ground or a guard wiring is formed next to a wiring. A wiring which does not satisfy design conditions of a guard wiring set in advance on the basis of the detection result is detected as an error wiring.

However, in the board wiring process system in Japanese Unexamined Patent Publication No. 2000-20573, only an error wiring is displayed, and a place required to be corrected or a place which can be corrected is not displayed. Therefore, when a given place where a printed wiring layer is arranged next to a guard wiring and a place different from the given place are mixed, a designer must check a printed wiring layer displayed as an error wiring to find and correct a place where no guard wiring is formed.

Therefore, means which displays places where no guard wirings are formed on a printed board is conceived. However, when a guard wiring is actually formed, depending on an arrangement of part terminals and an interval between the guard wiring and an adjacent printed wiring layer, a place where the guard wiring cannot be physically formed is present. When a board layout check system is applied to the place, the place is determined as an error place. For this reason, the designer must determine again whether or not the error place can be corrected.

SUMMARY OF THE INVENTION

The present invention provides a board layout check apparatus and a board layout check method for solving the above problems, and has as its object to provide an apparatus and method which appropriately displays a place where a guard wiring must be formed and can efficiently perform board layout correction.

In order to solve the above problem, the board layout check apparatus of the present invention includes a printed board obtained by forming a guard wiring on a printed wiring layer, a check target wiring detecting unit which detects a check target wiring the influence of noise of which must be reduced from the printed wiring layer, a guard wiring exemption region calculating unit which calculates a guard wiring exemption region in which no guard wiring is formed for the check target wiring, a guard wiring detecting unit which detects a wiring portion in which a guard wiring is formed for the check target wiring in a region except for the guard wiring exemption region, an error determination unit which determines whether or not the guard wirings detected by the guard wiring detecting unit are formed along the check target wiring in all regions except for the guard wiring exemption region calculated by the guard wiring exemption region calculating unit; and an output unit which outputs a wiring portion determined as an error by the error determination unit, wherein it is checked whether or not the guard wiring is appropriately formed for the printed wiring layer.

In this manner, the wiring portion where the guard wiring must be formed is clearly displayed, and the guard wiring can be reliably formed.

DESCRIPTION OF THE PREFERRED EMBODIMENTS

Figure 1:
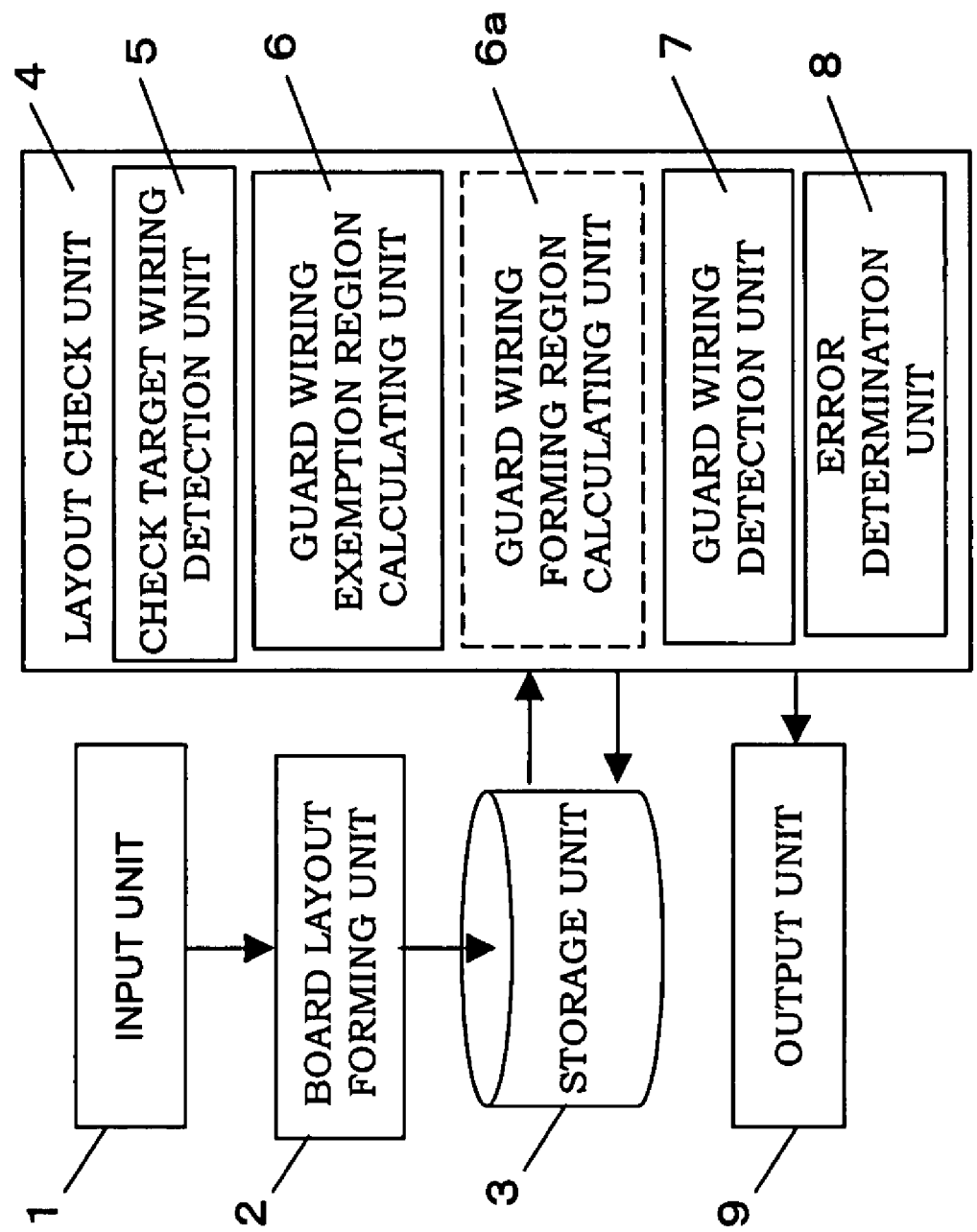
FIG. 1 is a block diagram showing a configuration of a board layout check apparatus according to the present invention.

The present invention will be described below outline.

The board layout check apparatus of the present invention includes a printed board obtained by forming a guard wiring on a printed wiring layer, a check target wiring detecting unit which detects a check target wiring the influence of noise of which must be reduced from the printed wiring layer, a guard wiring exemption region calculating unit which calculates a guard wiring exemption region in which no guard wiring is formed for the check target wiring, a guard wiring detecting unit which detects a wiring portion in which a guard wiring is formed for the check target wiring in a region except for the guard wiring exemption region, an error determination unit which determines whether or not the guard wirings detected by the guard wiring detecting unit are formed along the check target wiring in all regions except for the guard wiring exemption region calculated by the guard wiring exemption region calculating unit; and an output unit which outputs a wiring portion determined as an error by the error determination unit, wherein it is checked whether or not the guard wiring is appropriately formed for the printed wiring layer.

The guard wiring exemption region calculating unit calculates a guard wiring exemption region on the basis of an interval between pins of a part connected to the check target wiring, an interval between the guard wiring and the check target wiring, or a wiring width of the check target wiring. Further, the guard wiring exemption region calculating unit calculates a guard wiring exemption region from a diameter of a via, a distance from a pin of a part to which the check target wiring is connected to the via, or an interval between the guard wiring and the check target wiring.

Furthermore, the board layout check apparatus of the present invention includes an error wiring extract unit which calculates a ratio of a total wiring length of a wiring portion in which no guard wiring is formed for the check target wiring or a check target wiring length to a total wiring length of a wiring portion in which no guard wiring is formed.

Further, the board layout check apparatus of the present invention includes a printed board obtained by forming a guard wiring on a printed wiring layer, a check target wiring detecting unit which detects a check target wiring the influence of noise of which must be reduced from the printed wiring layer, a guard wiring forming region calculating unit which calculates a guard wiring forming region in which a guard wiring must be formed for the check target wiring, a guard wiring detecting unit which detects a wiring portion in which a guard wiring is formed for the check target wiring in the guard wiring forming region, an error determining unit which determines whether or not the guard wirings detected by the guard wiring detecting unit are formed along the check target wiring in all regions in the guard wiring forming region calculated by the guard wiring forming region calculating unit; and an output unit which outputs a wiring portion determined as an error by the error determination unit, wherein it is checked whether or not the guard wiring is appropriately formed for the printed wiring layer Furthermore, the board layout check apparatus of the present invention includes an error wiring extract unit which calculates a ratio of a total wiring length of a wiring portion in which no guard wiring is formed for the check target wiring or a check target wiring length to a total wiring length of a wiring portion in which no guard wiring is formed.

According to another aspect of the present invention, the board layout check method includes the check target wiring detecting step of detecting a check target wiring the influence of noise of which must be reduced from the printed wiring layer for which a guard wiring is formed on a printed board, the guard wiring exemption region calculating step of calculating a guard wiring exemption region in which no guard wiring is formed for the check target wiring, the guard wiring detecting step of detecting a wiring portion in which a guard wiring is formed for the check target wiring in a region except for the guard wiring exemption region, the error determining step of determining whether or not the guard wirings are formed along the check target wiring in all regions except for the guard wiring exemption region and the output step of outputting a wiring portion determined as an error in the error determining step, wherein it is checked whether or not the guard wiring is appropriately formed for the printed wiring layer.

Further, according to another aspect of the present invention, the board layout check method includes the check target wiring detecting step of detecting a check target wiring the influence of noise of which must be reduced from the printed wiring layer for which a guard wiring is formed on a printed board, the guard wiring forming region calculating step of calculating a guard wiring forming region in which a guard wiring must be formed for the check target wiring, the guard wiring detecting step of detecting a wiring portion in which a guard wiring is formed for the check target wiring in the guard wiring forming region, the error determining step of determining whether or not the guard wirings are formed along the check target wiring in all regions in the guard wiring forming region; and the output step of outputting a wiring portion determined as an error in the error determining step, wherein it is checked whether or not the guard wiring is appropriately formed for the printed wiring layer.

Furthermore, the present invention is a computer readable recording medium wherein a board layout check program to execute the above steps is recorded.

According to the present invention, by using the above means, a wiring portion in which a guard wiring can be corrected and which must be corrected can be specified. A designer can efficiently correct a board layout.

A board layout check apparatus according to the present invention will be described in detail with reference to the accompanying drawings. FIG. 1 is a block diagram of a configuration of the board layout check apparatus according to the embodiment of the present invention. The board layout check apparatus can be integrated with a CAD (Computer Aided Design System) which performs board layout design. The board layout design and the board layout check apparatus are preferably configured to share data.

In an input unit 1, a designer uses a keyboard, a mouse, or the like to input wiring information such as a circuit diagram (or wiring diagram) required for board layout design, an outer shape or a size of a board, a part size, and terminal place information. These pieces of information are inputted by the designer, but may be acquired from a circuit diagram database, a board database, and a part database through a communication line.

A board layout forming unit 2 forms a board layout by inputted wiring information.

A storage unit 3 is constituted by a ROM, a RAM, a flash memory, or an HDD to store the formed board layout information.

The input unit 1, the board layout forming unit 2, the storage unit 3 constitute a board layout design apparatus.

A layout check unit 4 is a unit which determines, on the basis of the board layout information stored in the storage unit 3, whether or not the guard wiring is appropriately formed. The layout check unit 4 includes a check target wiring detection unit 5, a guard wiring exemption region calculating unit 6, a guard wiring detection unit 7, and an error determination unit 8.

These units are functional units which are realized such that a program is executed by a computer. Although not shown in FIG. 1, the apparatus according to the present invention includes a CPU (Central Processing Unit; control unit), reads the program stored in the storage unit 3, realize the functions of the present invention, and sequentially executes steps according to the flow chart of the present invention.

The check target wiring detection unit 5 detects a check target wiring the guard wiring of which must be checked by preset conditions (will be described later).

The guard wiring exemption region calculating unit 6 calculates a guard wiring exemption region which is exempted from formation of a guard wiring because the guard wiring is physically difficult to be formed. The calculation of the guard wiring exemption region will be described below with reference to FIGS. 3 and 4.

The guard wiring detection unit 7 detects a wiring portion in which a guard wiring is formed except for the guard wiring exemption region with respect to each check target wiring.

The error determination unit 8 determines whether or not a guard wiring is appropriately formed in a region except for the guard wiring exemption region. More specifically, the error determination unit 8 detects whether or not all guard wirings 24 are arranged along a path of a check target wiring 21 in a region except for a guard wiring exemption region X. As the guard wiring, a ground wired within a region having less than a predetermined distance from the check target wiring 21 is regarded. A ground wiring formed in a region having the predetermined distance or more from the check target wiring 21 is not regarded as a guard wiring.

An output unit 9 is constituted by, for example, a liquid crystal display device or a CRT and distinctively outputs a wiring portion determined as an error and a wiring portion in which a guard wiring is not arranged in a region except for the guard wiring exemption region on a printed board. For example, the wiring portions are displayed by using different display colors, blinking, or dialogue balloons.

Figure 2:
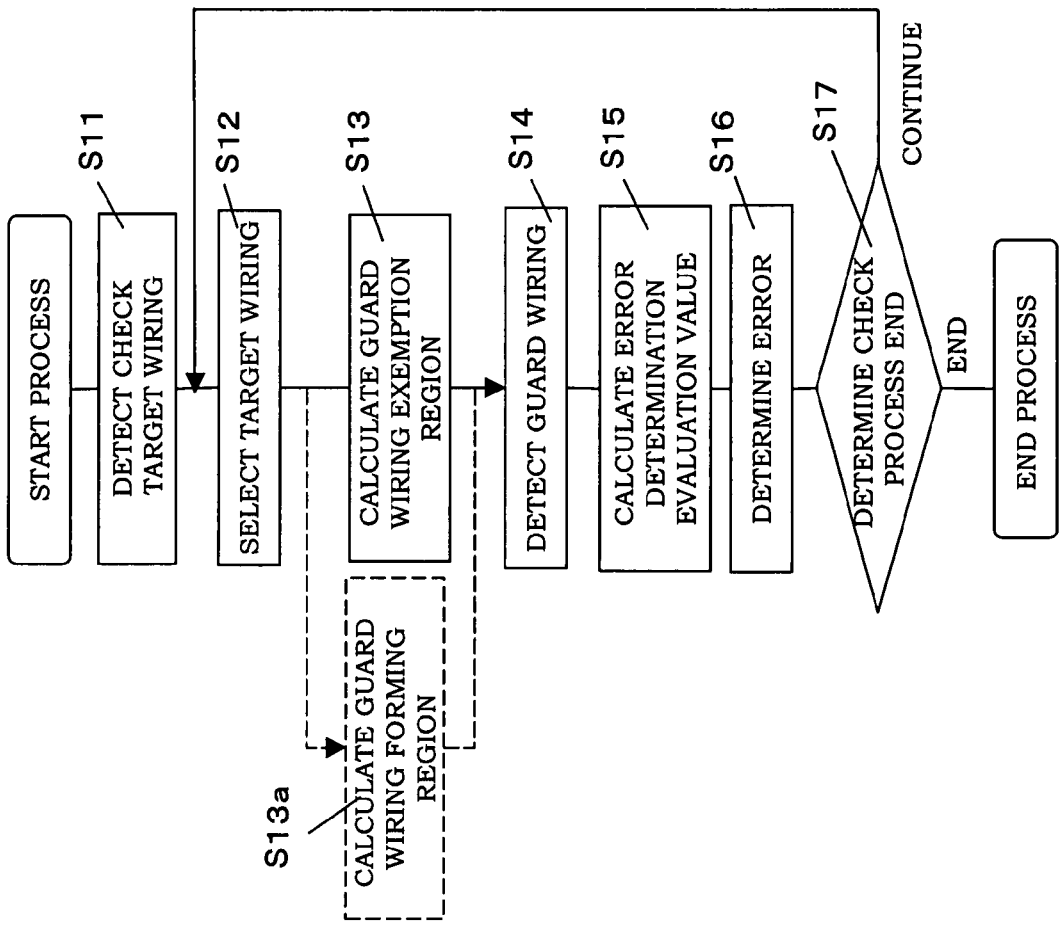
FIG. 2 is a flow chart showing a process of a layout check unit according to the present invention.

Processes of the layout check unit 4 executed by the CPU and the program will be described below in detail with reference to the flow chart in FIG. 2.

In check target wiring extracting step S11, a target wiring which checks whether or not a guard wiring is required on the basis of conditions determined by a designer et al. As the conditions, for example, a wiring type such as clock/data, a frequency of a signal to be transmitted, rising time/falling time, a power of a signal to be transmitted, and the like are used. The conditions are set such that influence of noise generated by other wirings and parts is reduced or influence of noise generated by the check target wiring to other wirings and parts is reduced. When the conditions set as described above are satisfied, the corresponding wiring is defined as a check target wiring. Alternatively, these wirings or other wirings may be directly designated by the designer as wirings to be checked.

In target wiring selecting step S12, the computer selects one wiring subjected to a determination process from a plurality of extracted check target wirings. One arbitrary wiring is selected in general, and other check target wirings are sequentially selected after error determination for the selected check target wiring is performed.

In guard wiring exemption region calculating step S13, a guard wiring exemption region is calculated from layout information of a wiring selected in step S12 and terminal information of a multi-terminal part such as an IC connected to the selected wiring.

Figure 3:
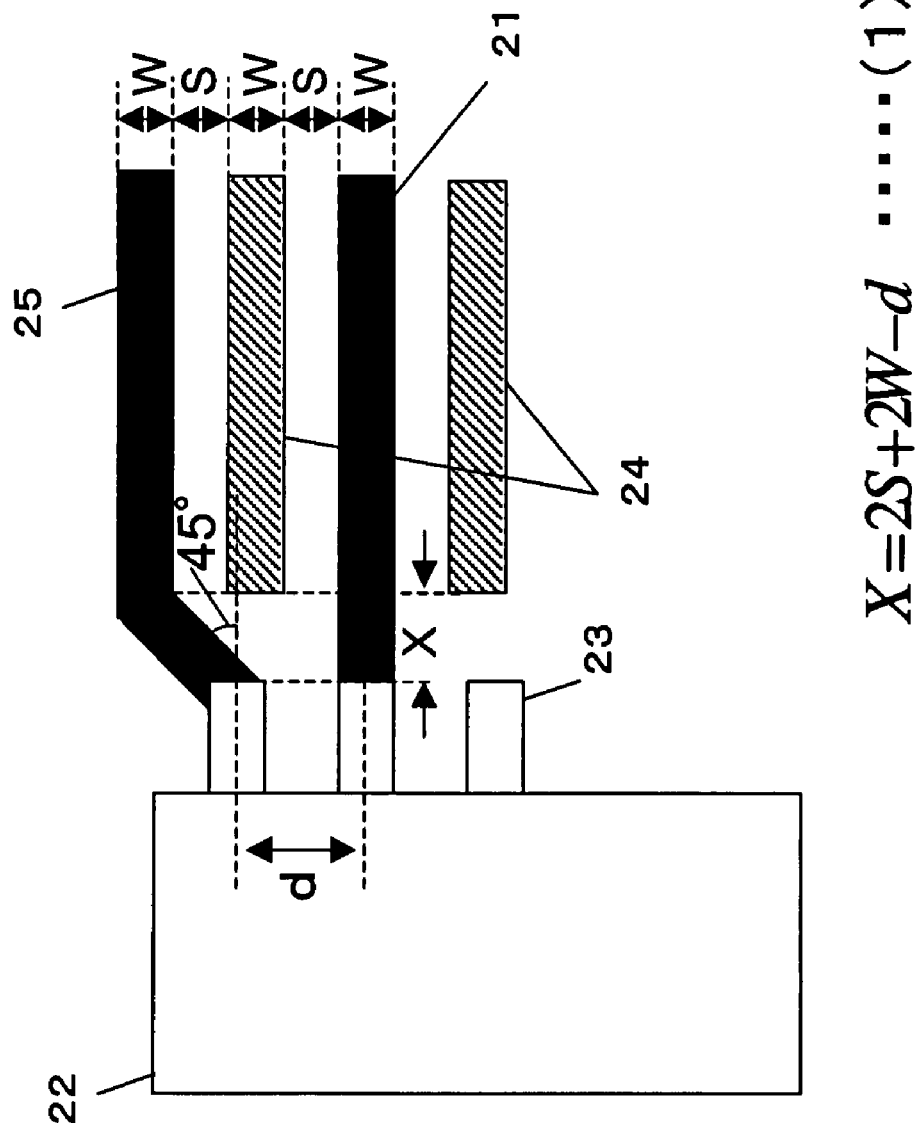
FIG. 3 is a diagram showing a first method of calculating a guard wiring exemption region which is a region in which a guard wiring is physically difficult to be formed.
Figure 4:
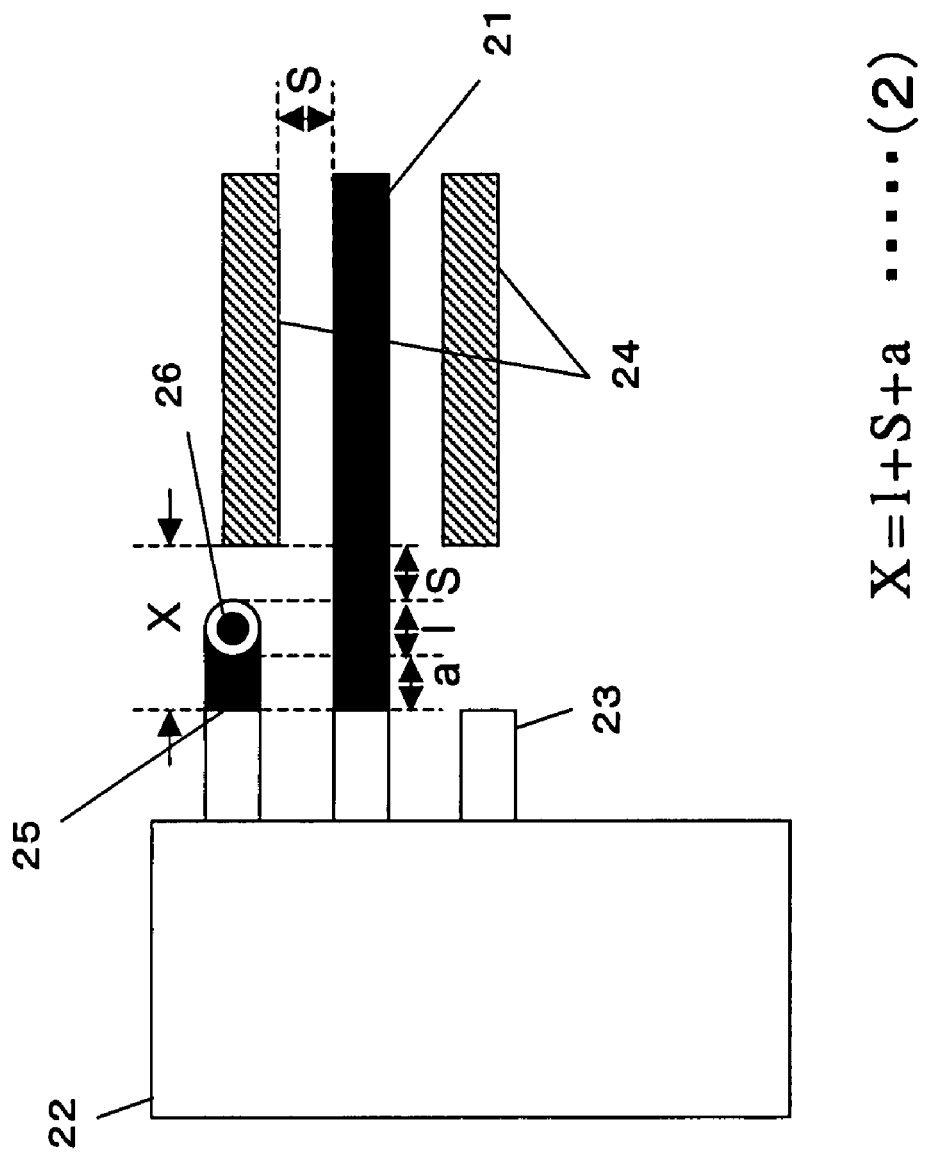
FIG. 4 is a diagram showing a second method of calculating a guard wiring exemption region which is a region in which a guard wiring is physically difficult to be formed.

FIGS. 3 and 4 show methods of calculating guard wiring exemption regions serving as regions in which guard wirings are physically difficult to be formed. In each of FIGS. 3 and 4, a guard wiring exemption region is calculated from a distance from a terminal. However, another expression such as a distance from a part may be used.

FIG. 3 shows a method of calculating a guard wiring exemption region when a printed wiring layer 25 adjacent to a terminal 23 to which the check target wiring 21 is connected is obliquely formed to avoid the guard wiring 24. On the basis of a wiring width W of the check target wiring 21, an interval d of the terminal 23 of a multi-terminal part 22 connected to the check target wiring 21, and an interval S between the guard wiring 24 and the check target wiring 21, a guard wiring exemption region X is calculated by the following equation 1.

$$X = 2S + 2W - d \quad \text{(Equation 1)}$$

In FIG. 3, although the widths of the guard wiring 24 and the check target wiring 21 are set to be equal to each other, different wiring widths may be used. Although a wiring angle of the adjacent printed wiring layer 25 is set at 45°, another angle may be used depending on design conditions or the like. As the interval S between the check target wiring 21 and the guard wiring 24, a distance preset by a designer or a distance regarded as the guard wiring 24 of the check target wiring 21 used to check the guard wiring 24 is used.

FIG. 3 shows a diagram for calculating the guard wiring exemption region X near the terminal 23 of the electronic part 22 and explains a calculational expression at such a place. For example, when a guard wiring exemption region X between the check target wiring 21 and the printed wiring layer is calculated, the guard wiring exemption region X can be calculated from the wiring width W of the check target wiring 21 and the interval S between the guard wiring 24 and the check target wiring 21. Furthermore, when the adjacent printed wiring layer 25 is not obliquely formed at an angle of 45° as shown in FIG. 3 but formed in parallel to the check target wiring 21, the guard wiring exemption region X can be calculated from the inter-terminal interval d which is an interval between the terminals 23 of the multi-terminal part 22 connected to the check target wiring 21. In this manner, on the basis of at least one or a combination of two or more of the wiring width W of the check target wiring 21, the inter-terminal interval d which is an interval between the terminals 23 of the multi-terminal part 22 connected to the check target wiring 21, and the interval S between the guard wiring 24 and the check target wiring 21, the guard wiring exemption region X can be calculated.

FIG. 4 shows a method of calculating a guard wiring exemption region when the printed wiring layers 25 adjacent to the terminals 23 to which the check target wiring 21 are connected in multilevel to avoid the guard wiring 24. On the basis of a diameter l of a via 26, the interval S between the guard wiring 24 and the check target wiring 21, and a minimum wiring length a which is a wiring length which is minimum required from the terminal 23 to the via 26, the guard wiring exemption region X is calculated by the following equation 2.

$$X = l + S + a \quad \text{(Equation 2)}$$

FIG. 4 shows a case in which the guard wiring exemption region X when the via 26 is formed at a place of the electronic part 22 near the terminal 23 is calculated. However, depending on the place of the via 26 and the minimum wiring length a from the terminal 23 to the via 26, the guard wiring exemption region X can be calculated from the diameter l of the via 26, the interval S between the guard wiring 24 and the check target wiring 21, or the minimum wiring length a which is a wiring length which is minimum required from the terminal 23 to the via 26.

The guard wiring exemption region X may be calculated from a frequency or the like but a shape or layout information of a printed wiring layer or a guard wiring as shown in FIGS. 3 and 4. Alternatively, a designer may designate the guard wiring exemption region X without performing the above calculation. When the guard wiring exemption region X is more strictly calculated, the guard wiring exemption region X may be set by analysis or the like in consideration of an influence in a case where no guard wiring is formed.

In guard wiring detecting step S14, it is detected whether or not the guard wiring 24 is formed along the path of the check target wiring 21 in a region except for the guard wiring exemption region X. A ground wired within a region having less than a predetermined distance from the check target wiring 21 may be regarded as a guard wiring. A ground wiring formed in a region having the predetermined distance or more from the check target wiring 21 may not be regarded as a guard wiring. In general, although the distance used here is set by the designer, the distance may be calculated from a frequency or the like of a signal.

In error determination evaluation value calculating step S15, in the region except for the guard wiring exemption region detected in the guard wiring detecting step S14, an evaluation value used in error determination is calculated from information at a place where no guard wiring is formed. As the evaluation value, a wiring length of a place where no guard wiring is formed, a sum of wiring lengths, a ratio of the wiring length of the place where no guard wiring is formed to a total wiring length, or the like is used. Alternatively, the number of places where no guard wirings are formed may be used. A distance between the place where no guard wiring is formed and a part which influenced by noise or a part which gives an influence of noise may be used. In this manner, a printed wiring layer in which guard wirings are not sufficiently formed can be extracted. The evaluation values may be displayed in an order of the sums, an order of the ratios, an order of the numbers of places where no guard wirings are formed or an order of the distances between the positions where no guard wirings are formed and the part which influenced by noise or the part which gives an influence of noise.

In error determining step S16, error determination is performed by the evaluation value. A designer may perform layout correction in her/his judgement on the basis of the calculated evaluation value without performing the process in the error determining step S16.

In check process end determining step S17, it is checked whether error determination is performed to all wirings detected in the check target wiring detecting step S11. When all the check target wirings are not determined, the control flow returns to the target wiring selecting step S12 to select another check target wiring and to perform the same process. The error determination is performed to all the check target wirings, the process of the layout check unit 4 is ended.

A result obtained in the layout check unit 4 is sent to the output unit 9. In the output unit 9, an error determination result of a check target wiring, an evaluation value, and a place where no guard wiring is formed except for a guard wiring exemption region are outputted. A designer corrects a board layout on the basis of these pieces of information. According to the present invention, since information of a place which cannot be corrected is not outputted, a place which can be corrected can be efficiently corrected.

In the above embodiment, the guard wiring exemption region calculating unit 6 calculates a region which is exempted from formation of a guard wiring because a guard wiring is physically difficult to be formed in the region. In contrast to this, when a guard wiring forming region calculating unit 6a which calculates a region in which a guard wiring is physically required to be formed and which calculates a region in which a guard wiring is positively formed is arranged, the present invention can be similarly executed. In this manner, when the guard wiring forming region calculating unit 6a is arranged, the step S13 in the flow chart in FIG. 2 is replaced with a calculate guard wiring forming region step S13a of calculating a region in which a guard wiring is formed.

As described above, in board layout check which checks whether or not a guard wiring is appropriately formed, an error place is displayed such that a wiring near a terminal of a multi-terminal part for which a guard wiring is physically difficult to be formed is excluded from targets. For this reason, a designer can easily correct only a place which can be corrected, and can efficiently perform board layout correction.

The is claimed is:

1. A board layout check apparatus comprising:
a print board obtained by forming a guard wiring on a printed wiring layer;
a check target wiring detecting unit which detects a check target wiring the influence of noise of which must be reduced from the printed wiring layer;
a guard wiring exemption region calculating unit which calculates a guard wiring exemption region in which no guard wiring is formed for the check target wiring;
a guard wiring detecting unit which detects a wiring portion in which a guard wiring is formed for the check target wiring in a region except for the guard wiring exemption region;
an error determination unit which determines whether or not the guard wirings detected by the guard wiring detecting unit are formed along the check target wiring in all regions except for the guard wiring exemption region calculated by the guard wiring exemption region calculating unit; and
an output unit which outputs a wiring portion determined as an error by the error determination unit.

2. The board layout check apparatus according to claim 1, wherein
the guard wiring exemption region calculating unit calculates a guard wiring exemption region on the basis of an interval between pins of a part connected to the check target wiring, an interval between the guard wiring and the check target wiring, or a wiring width of the check target wiring.

3. The board layout check apparatus according to claim 1, wherein
the guard wiring exemption region calculating unit calculates a guard wiring exemption region X by the following equation 1:

$$X = 2S + 2W - d \quad \text{(Equation 1)}$$

wherein
w is a wiring width of the check target wiring,
d is an interval between terminals of a multi-terminal part connected to the check target wiring, and
s is an interval between the guard wiring and the check target wiring.

4. The board layout check apparatus according to claim 1, wherein
the guard wiring exemption region calculating unit calculates a guard wiring exemption region from a diameter of a via, a distance from a pin of a part to which the check target wiring is connected to the via, or an interval between the guard wiring and the check target wiring.

5. The board layout check apparatus according to claim 1, wherein
the guard wiring exemption region calculating unit calculates a guard wiring exemption region X by the following equation 2:

$$X = 1 + S + a \quad \text{(Equation 2)}$$

wherein
1 is a diameter of the via,
S is an interval between the guard wiring and the check target wiring, and
a is a minimum wiring length which is a wiring length which is minimum required from the terminal to the via.

6. The board layout check apparatus according to claim 1, further comprising an error wiring extract unit which calculates a ratio of a total wiring length to a wiring length of a wiring portion in which no guard wiring is formed for the check target wiring or a check target wiring length to a total wiring length of a wiring portion in which no guard wiring is formed.

7. A board layout check method, performed by a board layout check apparatus including a check target wiring detecting unit, a guard wiring exemption region calculating unit, a guard wiring detecting unit, an error determination unit, and an output unit, the method comprising:

a step of forming a guard wiring on a printed wiring layer to obtain a printed board;

a step of detecting, performed by the check target wiring detecting unit, a check target wiring the influence of noise of which must be reduced from the printed wiring layer for which a guard wiring is formed on the printed board;

a step of calculating, performed by the guard wiring exemption region calculating unit, a guard wiring exemption region in which no guard wiring is formed for the check target wiring;

a step of detecting, performed by the guard wiring detecting unit, a wiring portion in which a guard wiring is formed for the check target wiring in a region except for the guard wiring exemption region;

a step of determining, performed by the error determination unit, whether or not the guard wirings are formed along the check target wiring in all regions except for the guard wiring exemption region; and a step of outputting, performed by the output unit, a wiring portion determined as an error in the error determining step.

8. A computer readable storage medium wherein a board layout check program to execute the steps according to claim 7 is recorded.

* * * * *